(12) United States Patent
Kobayashi et al.

(10) Patent No.: US 8,916,846 B2
(45) Date of Patent: Dec. 23, 2014

(54) NONVOLATILE MEMORY DEVICE

(71) Applicant: Kabushiki Kaisha Toshiba, Tokyo (JP)

(72) Inventors: Shigeki Kobayashi, Mie-ken (JP);
Takeshi Yamaguchi, Mie-ken (JP);
Yasuhiro Nojiri, Kanagawa-ken (JP);
Masaki Yamato, Mie-ken (JP);
Hiroyuki Fukumizu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/848,318

(22) Filed: Mar. 21, 2013

(65) Prior Publication Data

US 2014/0061567 A1 Mar. 6, 2014

Related U.S. Application Data

(60) Provisional application No. 61/697,080, filed on Sep. 5, 2012.

(51) Int. Cl.
*H01L 29/02* (2006.01)
*H01L 47/00* (2006.01)
*H01L 45/00* (2006.01)
*H01L 27/24* (2006.01)

(52) U.S. Cl.
CPC .............. *H01L 45/12* (2013.01); *H01L 45/146* (2013.01); *H01L 45/06* (2013.01); *H01L 27/2409* (2013.01); *H01L 27/2481* (2013.01); *H01L 45/144* (2013.01); *H01L 45/1233* (2013.01); *H01L 45/04* (2013.01); *H01L 45/147* (2013.01)
USPC ........................................................... 257/2

(58) Field of Classification Search
CPC ... H01L 27/11556; H01L 27/24; H01L 45/12; H01L 45/144; H01L 45/147; H01L 45/06; H01L 27/2409
See application file for complete search history.

(56) References Cited

U.S. PATENT DOCUMENTS

| | | | |
|---|---|---|---|
| 2006/0250836 A1* | 11/2006 | Herner et al. | 365/148 |
| 2007/0215977 A1 | 9/2007 | Lee et al. | |
| 2008/0049490 A1 | 2/2008 | Hosaka et al. | |
| 2010/0259967 A1 | 10/2010 | Yasuda et al. | |
| 2011/0204311 A1 | 8/2011 | Gorer et al. | |
| 2012/0091427 A1* | 4/2012 | Chen et al. | 257/5 |
| 2012/0319074 A1 | 12/2012 | Fujii et al. | |

FOREIGN PATENT DOCUMENTS

| | | |
|---|---|---|
| JP | 2007-243183 A | 9/2007 |
| JP | 2008-41778 A | 2/2008 |
| JP | 2009-135206 A | 6/2009 |
| JP | 2011-205045 A | 10/2011 |

* cited by examiner

*Primary Examiner* — William D Coleman
(74) *Attorney, Agent, or Firm* — Oblon, Spivak, McClelland, Maier & Neustadt, L.L.P.

(57) ABSTRACT

According to one embodiment, a nonvolatile memory device includes a first wiring, a second wiring, and a memory cell provided between the first wiring and the second wiring. The memory cell includes a memory layer, a rectifying element layer, and a protective resistance layer including a first semiconductor layer of a first conductivity type and a second semiconductor layer of a second conductivity type.

20 Claims, 7 Drawing Sheets

NONVOLATILE MEMORY DEVICE

CROSS-REFERENCE TO RELATED APPLICATIONS

This application is based upon and claims the benefit of priority from U.S. Provisional Patent Application 61/697,080, filed on Sep. 5, 2012; the entire contents of which are incorporated herein by reference.

FIELD

Embodiments described herein relate generally to a nonvolatile memory device.

BACKGROUND

As a high-capacity nonvolatile memory device, the NAND flash memory has been widely used. However, with the device miniaturization, the NAND flash memory has been approaching the physical limit. Recently, new memories such as ferroelectric memory, magnetoresistive memory, phase change memory, and resistance change memory have been developed. Among them, the resistance random access memory (ReRAM) is drawing attention.

A memory cell of the resistance random access memory typically includes a rewritable memory layer (rewritable layer) and wiring layers sandwiching the memory layer. For instance, in the case of using the memory cells as a cell array, an electrical bias or current is externally applied to perform writing, erasing, and reading. To this end, word lines and bit lines are provided above and below the memory cell. In the resistance random access memory, with the miniaturization of memory cells, memory cells with higher reliability have been required.

DETAILED DESCRIPTION

Figure 1A:
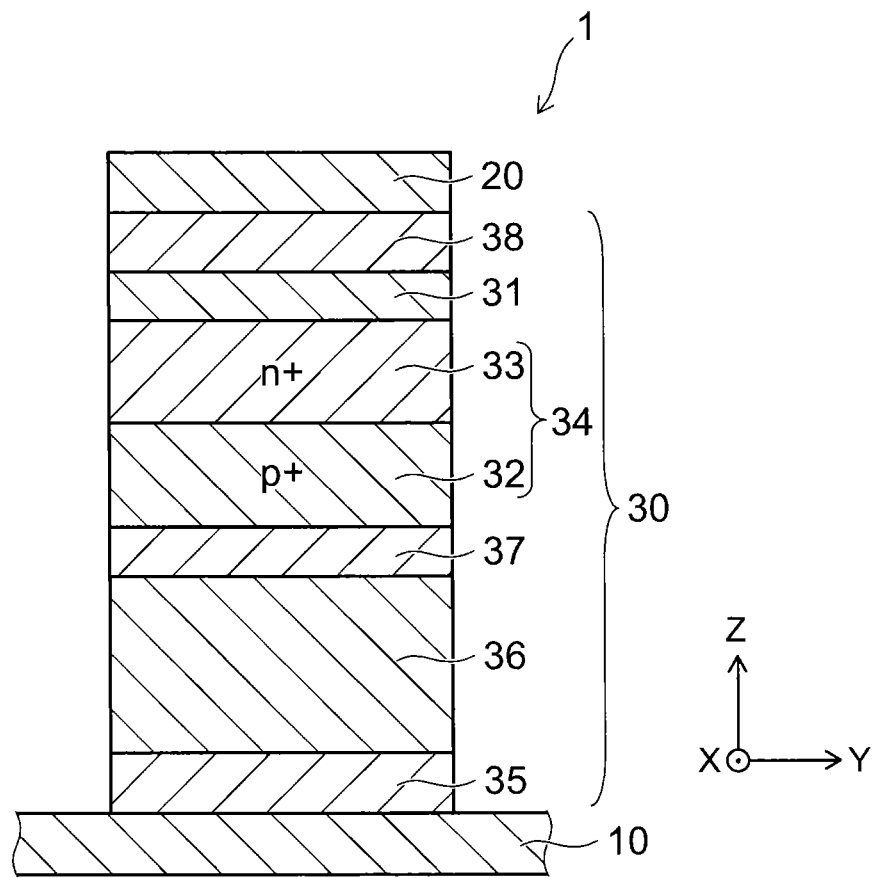
FIGS. 1A and 1B are schematic views of a nonvolatile memory device according to a first embodiment.

In general, according to one embodiment, a nonvolatile memory device includes a first wiring, a second wiring, and a memory cell provided between the first wiring and the second wiring. The memory cell includes a memory layer, a rectifying element layer, and a protective resistance layer including a first semiconductor layer of a first conductivity type and a second semiconductor layer of a second conductivity type.

Embodiments will now be described with reference to the drawings. In the following description, like members are labeled with like reference numerals. The description of the members once described is omitted appropriately.

First Embodiment

Figure 1B:
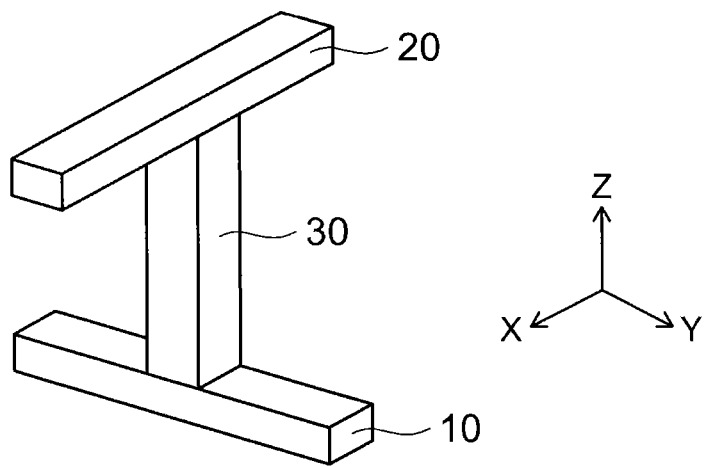

FIGS. 1A and 1B are schematic views of a nonvolatile memory device according to a first embodiment. FIG. 1A is a schematic sectional view, and FIG. 1B is a schematic perspective view.

The nonvolatile memory device 1 according to the first embodiment includes a wiring 10 (first wiring), a wiring 20 (second wiring), and a memory cell 30 sandwiched between the wiring 10 and the wiring 20. The memory cell 30 is provided between the wirings. The wiring 10 is e.g. a word line of the nonvolatile memory device. The wiring 20 is e.g. a bit line of the nonvolatile memory device.

The wiring 10 extends in the Y direction in the figure. The wiring 20 extends in the X direction non-parallel to the Y direction. A memory layer 31 is located between the wiring 10 and the wiring 20 crossing each other.

The memory cell 30 includes a memory layer 31 and a protective resistance layer 34. The protective resistance layer 34 includes a $p^+$-type (first conductivity type) semiconductor layer 32 (first semiconductor layer) and an $n^+$-type (second conductivity type) semiconductor layer 33 (second semiconductor layer).

The concentration of the impurity element contained in the semiconductor layers 32, 33 is set to a high concentration. The semiconductor layer 32 is in contact with the semiconductor layer 33. The memory layer 31 is in contact with the protective resistance layer 34.

The memory cell 30 further includes a rectifying element layer 36, a metal film 35, a metal film 37, and a metal film 38.

That is, in the memory cell 30, from the wiring 10 side to the wiring 20 side, the metal film 35, the rectifying element layer 36, the metal film 37, the protective resistance layer 34, the memory layer 31, and the metal film 38 are stacked.

In the memory cell 30, the rectifying element layer 36 and the memory layer 31 are connected in series. Thus, a current flows in one direction of the memory cell 30.

In the state illustrated in FIG. 1A, the semiconductor layer 32 is placed on the wiring 10 side, and the semiconductor layer 33 is placed on the wiring 20 side. Besides, the first embodiment also includes a structure in which the stacking order of the semiconductor layers 32, 33 is reversed. In this case, the semiconductor layer 32 is placed on the wiring 20 side, and the semiconductor layer 33 is placed on the wiring 10 side.

The protective resistance layer 34 is also a diode (e.g., Esaki diode) in which the $p^+$-type semiconductor layer 32 and the $n^+$-type semiconductor layer 33 are in contact with each other.

The material of the semiconductor layer 32 includes polysilicon (poly-Si). The concentration of the impurity element contained in this polysilicon is $1 \times 10^{19}$ atoms/cm$^3$ or more. The polysilicon of the semiconductor layer 32 is doped with e.g. boron (B).

The material of the semiconductor layer 33 includes polysilicon (poly-Si). The concentration of the impurity element contained in this polysilicon is $1 \times 10^{19}$ atoms/cm$^3$ or more. The polysilicon of the semiconductor layer 33 is doped with phosphorus (P) or arsenic (As). Boron (B) and phosphorus (P) has high solid solubility to polysilicon. Thus, for the impurity element added to polysilicon, it is preferable to use e.g. boron (B) and phosphorus (P).

The concentration of the impurity element contained in the semiconductor layer 32 does not need to be constant in the stacking direction (Z direction) of the memory cell 30. For instance, in order to join the semiconductor layer 32 and the metal film 37 by ohmic contact, the concentration of the impurity element contained in the semiconductor layer 32 is made higher toward the metal film 37. That is, the concentration of the impurity element contained in the semiconductor layer 32 is provided with a gradient.

Similarly, the concentration of the impurity element contained in the semiconductor layer 33 does not need to be constant in the stacking direction (Z direction) of the memory cell 30, either. For instance, although not shown, in the case of providing another metal film between the semiconductor layer 33 and the memory layer 31, the concentration of the impurity element contained in the semiconductor layer 33 is provided with a gradient.

The material of the semiconductor layer 32 and the material of the semiconductor layer 33 may include a mixed crystal of silicon (Si) and germanium (Ge).

The memory layer 31 is a layer in which the characteristics (e.g., resistance) of the memory layer 31 are changed in response to the voltage applied between the upper end of the memory layer 31 and the lower end of the memory layer 31. For instance, a current is supplied to the memory layer 31 via the wiring 10 and the wiring 20. Then, the memory layer 31 can transfer reversibly between a first state and a second state.

Depending on the combination of the voltage applied between the wiring 10 and the wiring 20, the voltage applied between the upper end of the memory layer 31 and the lower end of the memory layer 31 can be changed in the memory layer 31. Due to the difference in this application voltage, the characteristics of the memory layer 31 are changed. Thus, information can be stored or erased in the memory cell 30. For instance, the reset state (high resistance state) of the memory layer 31 is denoted by "1", and the set state (low resistance state) is denoted by "0". By changing the resistance of the memory layer 31, information can be stored ("1") or erased ("0") in the memory cell 30.

The memory layer 31 is made of an arbitrary material whose characteristics are changed in response to application voltage. For instance, the memory layer 31 is based on a variable resistance layer whose resistance can transfer reversibly in response to the applied voltage. Alternatively, as an example of the memory layer, a phase change film may also be used. For instance, the memory layer 31 is based on a phase change layer which can transfer reversibly between the crystalline state and the amorphous state.

The material of the memory layer 31 can be a material including at least one selected from HfO$_x$, HfAlO$_x$, HfTiO$_x$, HfZrO$_x$, HfSiO$_x$, TaO$_x$, WO$_x$, ZrO$_x$, AlO$_x$, ZnMn$_x$O$_y$, ZnFe$_x$O$_y$, NbO$_x$, Cr-doped SrTiO$_{3-x}$, Pr$_x$Ca$_y$MnO$_z$, ZrO$_x$, NiO$_x$, Ti-doped NiO$_x$ film, ZnO$_x$, TiO$_x$, TiO$_x$N$_y$, CuO$_x$, GdO$_x$, CuTe$_x$, C (carbon), CN (carbon nitride), chalcogenide-based GST (Ge$_x$Sb$_y$Te$_z$) changing the resistance state by Joule heat generated in response to voltage applied thereacross, N-doped GST formed by doping GST, O-doped GST formed by doping GST, Ge$_x$Sb$_y$, In$_x$Ge$_y$Te$_z$, nitride compounds of the materials listed above, and the like.

In the nonvolatile memory device 1, a metal film is provided between the protective resistance layer 34 and at least one of the wiring 10 and the wiring 20 (FIG. 1A). Each of the metal films 35, 37, 38 illustrated in FIG. 1A is a barrier film. This barrier film suppresses component diffusion into the layer provided on an upper side of and on a lower side of the barrier film. For example, titanium (Ti) or titanium nitride (TiN) can be used for the metal films 35, 37, 38.

For the material of the wiring 10, 20, for instance, a metal having good high-temperature heat resistance and low resistivity is used. For instance, for the material of the wiring 10, 20, tungsten (W) is used. Alternatively, for the material of the wiring 10, 20, tungsten nitride (WN) and tungsten carbide (WC) may also be used.

For the rectifying element layer 36, for instance, a PIN diode, PN junction diode, Schottky diode, Zener diode and the like are used. The material of the rectifying element layer 36 includes e.g. polysilicon (poly-Si). For the material of the rectifying element layer 36, besides polysilicon, a semiconductor material such as germanium (Ge) and a semiconductor material of metal oxides such as NiO, TiO, CuO, and InZnO may be combined.

In FIGS. 1A and 1B, the wiring 10, the wiring 20, and the memory cell 30 are illustrated one for each. However, the number of them is not limited to one.

Figure 2:
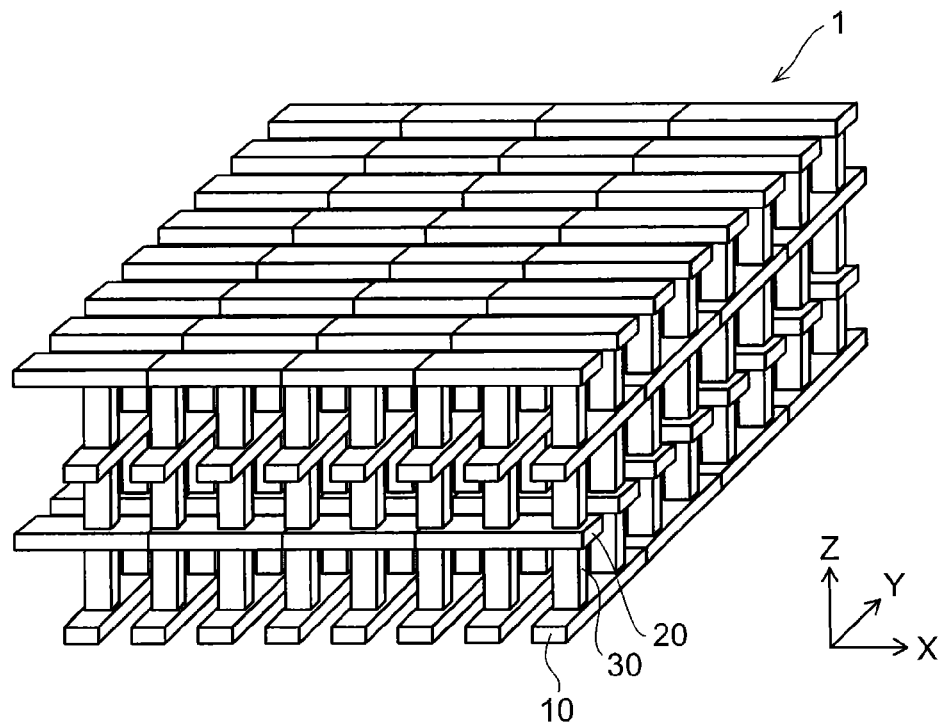
FIG. 2 is a schematic perspective view of a memory cell array section of the nonvolatile memory device according to the first embodiment.

FIG. 2 is a schematic perspective view of a memory cell array section of the nonvolatile memory device according to the first embodiment.

In the nonvolatile memory device 1, a plurality of wirings 10 are arranged in the X direction, and a plurality of wirings 20 are arranged in the Y direction. The plurality of wirings 10 and the plurality of wirings 20 are not limited to one stage for each, but stacked in a plurality of stages in the Z direction. For instance, a set of the plurality of wirings 10 and a set of the plurality of wirings 20 are alternately stacked in the Z direction. A memory cell 30 is provided between each of the plurality of wirings 10 and each of the plurality of wirings 20.

Thus, the memory cell array section of the nonvolatile memory device has a structure in which the memory cells 30 are stacked in a plurality of stages via the wiring 10 or the wiring 20. An interlayer insulating film (not shown) is provided between the plurality of memory cells 30.

Before describing the operation of the nonvolatile memory device 1, the operation of nonvolatile memory devices 100, 101 according to reference examples is described.

Figures 3A, 3B:
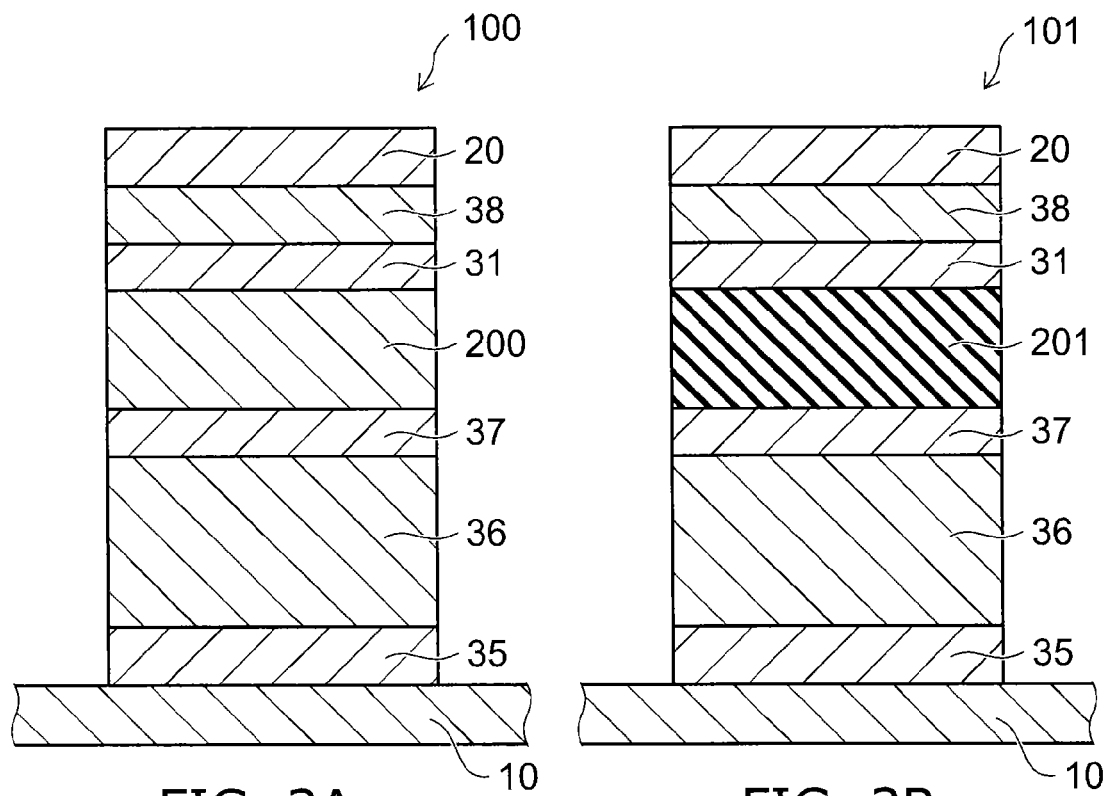
FIGS. 3A and 3B are schematic sectional views of nonvolatile memory devices according to reference examples.

FIGS. 3A and 3B are schematic sectional views of nonvolatile memory devices according to reference examples. FIG. 3A shows a first reference example, and FIG. 3B shows a second reference example.

In the nonvolatile memory device 100 illustrated in FIG. 3A, a protective resistance layer 200 is sandwiched between the memory layer 31 and the metal film 37. The protective resistance layer 200 is a monolayer. The protective resistance layer 200 is an n$^+$-type polysilicon layer. The concentration of the impurity element contained in the n$^+$-type polysilicon layer is set to a high concentration.

In the nonvolatile memory device 101 illustrated in FIG. 3B, a protective resistance layer 201 is sandwiched between the memory layer 31 and the metal film 37. The protective resistance layer 201 is a monolayer. The protective resistance layer 201 is a silicon oxide (SiO$_2$) layer.

Figure 4A:
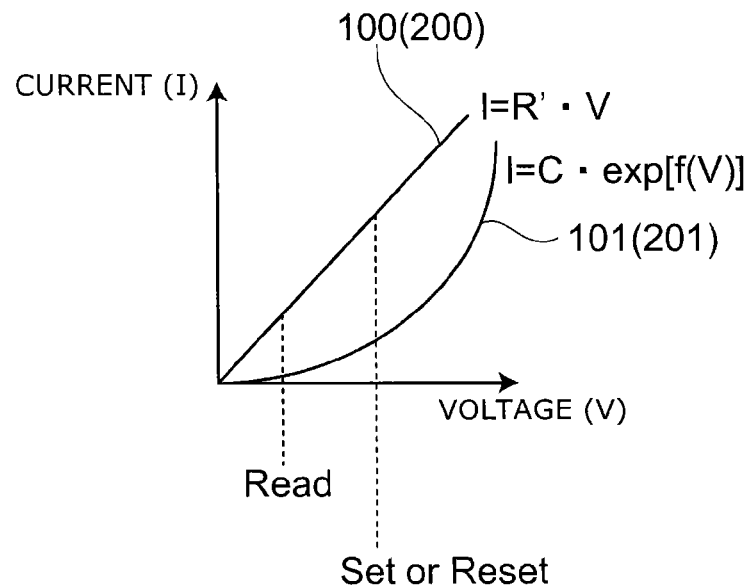
FIG. 4A shows voltage-current curves of the protective resistance layers according to the reference examples and FIG. 4B shows the relation of the set voltage and the resistance of the memory layer versus time in the set operation of the nonvolatile memory device according to the reference example.

FIG. 4A shows voltage-current curves of the protective resistance layers according to the reference examples.

Figure 4B:
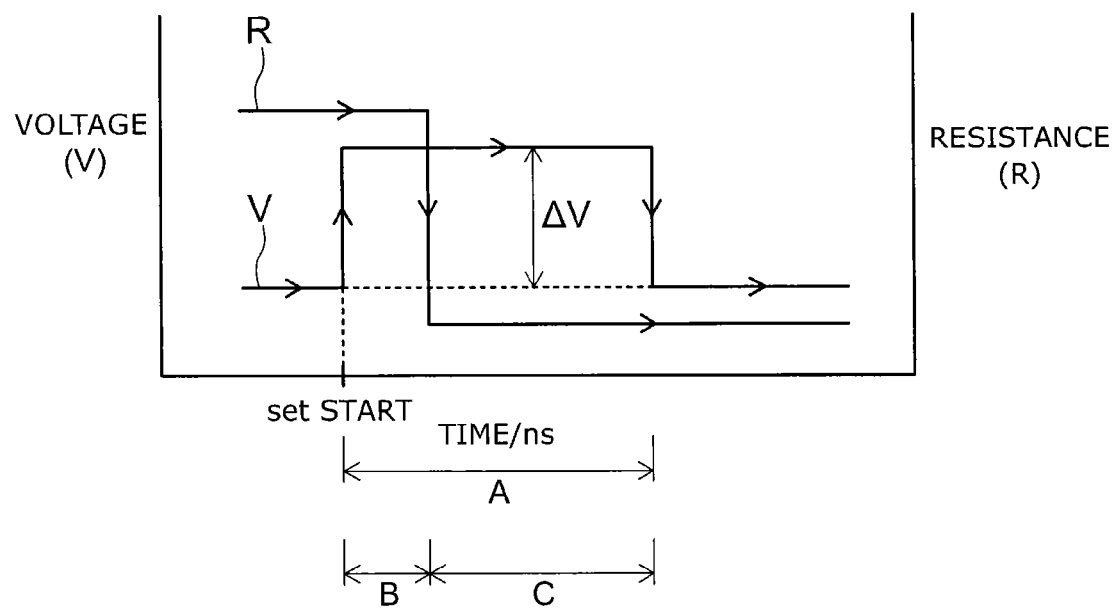

FIG. 4B shows the relation of the set voltage and the resistance of the memory layer versus time in the set operation of the nonvolatile memory device according to the reference example.

In FIG. 4A, the voltage (V) represents the voltage applied between the upper end of the protective resistance layer and the lower end of the protective resistance layer. The current (I) represents the current flowing between the upper end of the protective resistance layer and the lower end of the protective resistance layer. The following "R" represents the resistance of the protective resistance layer.

In the protective resistance layer 200 of the nonvolatile memory device 100, voltage and current are in a linear relation. More specifically, the voltage (V) and the current (I) of the protective resistance layer 200 can be expressed as I=R'·V (R'=1/R (R; resistance)). In the nonvolatile memory device 100, the protective resistance layer 200 exhibits ohmic characteristics in which the current (I) increases proportionally with the increase of the voltage (V).

On the other hand, in the protective resistance layer 201 of the nonvolatile memory device 101, voltage and current are in an exponential relation. More specifically, the voltage (V) and the current (I) of the protective resistance layer 201 can be expressed as I=C·exp(f(V)), where C is a constant. In the nonvolatile memory device 101, the protective resistance layer 201 exhibits the characteristics in which the current (I) increases exponentially with the increase of the voltage (V).

In other words, the protective resistance layers 201 exhibits the characteristics in which the resistance (R) decreases with the increase of the voltage (V). In such cases, the following trouble may occur.

For instance, a set operation to transfer from the reset state (high resistance state) to the set state (low resistance state) is performed for the nonvolatile memory device 101. In the set operation, a pulse-like voltage is applied for a prescribed time to the memory layer 31 in the high resistance state ("1"). For instance, a set voltage (ΔV) is applied for time A between the wiring 10 and the wiring 20. The time A is e.g. several hundred ns.

However, after starting the set operation and before completing the set operation, the memory layer 31 may transition from the reset state (high resistance state) to the set state (low resistance state). More specifically, after the lapse of time B from the start of the set operation, the memory layer 31 may transition from the reset state (high resistance state) to the set state (low resistance state). In this case, the time B is shorter than the time A.

Thus, even after the memory layer 31 transfers from the reset state (high resistance state) to the set state (low resistance state), the voltage ΔV continues to be applied between the wiring 10 and the wiring 20.

On the other hand, the protective resistance layer 201 exhibits the characteristics in which the resistance (R) decreases with the increase of the voltage (V) (FIG. 4A). Thus, during the time (time C) after the memory layer 31 transitions to the set state until completing the set operation, the resistance (R) of the protective resistance layer 201 is in a low state.

Accordingly, the voltage drop of the set voltage (ΔV) is made small. During the time C, the set voltage (ΔV) continues to be applied to the memory layer 31. Thus, during the time C, the memory layer 31 is subjected to an excessive electrical stress. Here, also in the transition from the set state (low resistance state) to the reset state (high resistance state), a similar phenomenon may occur. That is, in the nonvolatile memory devices 101, information cannot be stably written to the memory layer 31.

Furthermore, at the time of reading information (Read), a voltage lower than the set voltage is applied between the wiring 10 and the wiring 20 to read information. For instance, while the set voltage is several V, the read voltage at the time of reading is 1 V or less. However, at the time of reading, in the nonvolatile memory device 101, the resistance of the protective resistance layer 201 is high (FIG. 4A). Thus, the voltage drop of the voltage applied between the wiring 10 and the wiring 20 is made large. Hence, the voltage applied to the memory layer 31 is made excessively lower than the read voltage applied between the wirings 10, 20. Accordingly, in the nonvolatile memory device 101, the written information cannot be stably read.

That is, the protective resistance layer is preferably a layer having a sufficiently low resistance at the time of reading and having a sufficiently high resistance at the time of the set operation. On the other hand, the resistance of the protective resistance layer 201 exhibits constant according to the increase of the current (I) with the increase of the voltage (V) in the nonvolatile memory devices 100. Therefore, in the nonvolatile memory device 100, the written information cannot be stably read.

The operation of the nonvolatile memory device 1 is now described.

The protective resistance layer 34 incorporated in the nonvolatile memory device 1 includes an Esaki diode in which the p$^+$-type semiconductor layer 32 and the n$^+$-type semiconductor layer 33 are in contact with each other.

Figure 5A:
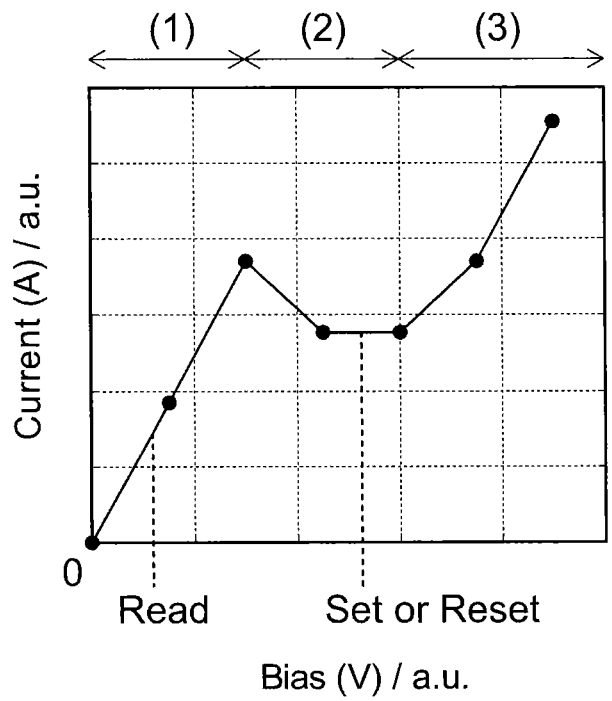
FIG. 5A shows a voltage-current curve of the protective resistance layer according to the first embodiment and FIG. 5B shows energy band structures of the protective resistance layer according to the first embodiment.
Figure 5B:
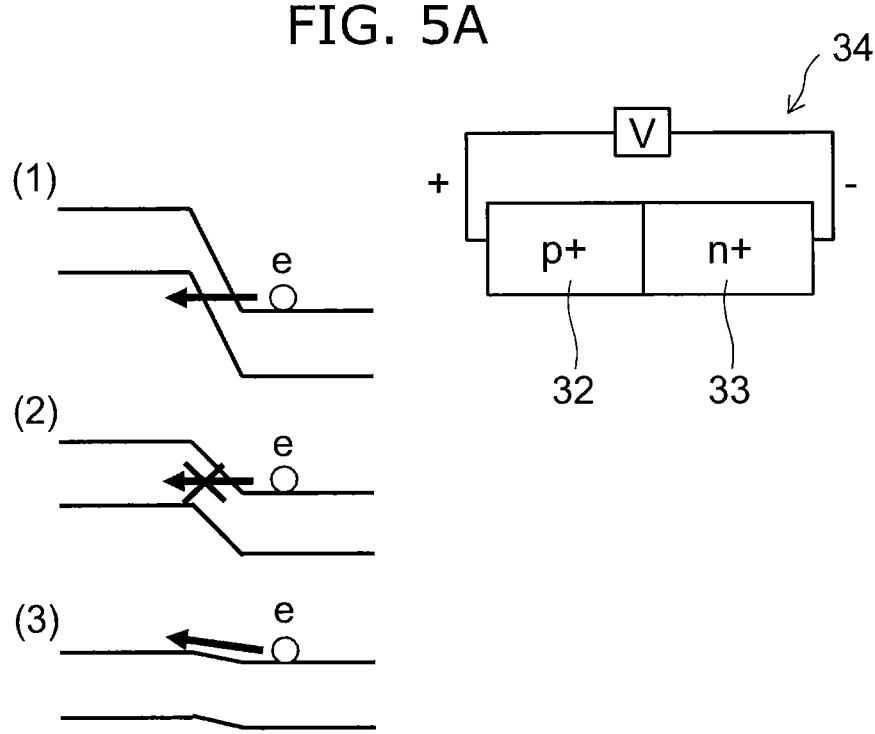

FIG. 5A shows a voltage-current curve of the protective resistance layer according to the first embodiment. The horizontal axis and vertical axis of FIG. 5A are represented in a.u. (arbitrary units). FIG. 5B shows energy band structures of the protective resistance layer according to the first embodiment.

First, in the region (1) of FIG. 5A, the energy band structure of the protective resistance layer 34 is in the state (1) of FIG. 5B. In the state (1), by the tunnel effect, electrons e flow from the semiconductor layer 33 to the semiconductor layer 32. That is, a prescribed tunnel current flows in the protective resistance layer 34. In the region (1), current increases with an increase of applied voltage.

In the region (2) of FIG. 5A, the energy band structure of the protective resistance layer 34 is in the state (2) of FIG. 5B. In the state (2), due to the pn junction barrier, electrons e flow less easily from the semiconductor layer 33 to the semiconductor layer 32. That is, in the state (2), the negative differential resistance appears; current decreases with an increase of applied voltage.

In the region (3) of FIG. 5A, the energy band structure of the protective resistance layer 34 is in the state (3) of FIG. 5B. In the state (3), due to lessening of the pn junction barrier, electrons e flow from the semiconductor layer 33 to the semiconductor layer 32.

Here, the voltage in the region (1) can be used as a read voltage, and the voltage in the region (2) can be used as a set voltage. Then, the protective resistance layer 34 functions as a layer having a sufficiently low resistance at the time of reading and having a sufficiently high resistance at the time of the set operation.

The set operation is performed on the nonvolatile memory device 1 including such a protective resistance layer 34. In the set operation, as an example, a positive potential is applied to the wiring 10, and a negative potential is applied to the wiring 20. As described above, after starting the set operation and before completing the set operation, the memory layer 31 may transition from the reset state to the set state (FIG. 4B). That is, the time B is made shorter than the time A. Thus, even after the memory layer 31 transitions from the reset state to the set state, the voltage ΔV is applied between the wiring 10 and the wiring 20.

However, the protective resistance layer 34 is a layer having a sufficiently low resistance at the time of reading and having a sufficiently high resistance at the time of the set operation (FIG. 5A). Thus, during the time (time C) after the memory layer 31 transitions to the set state until completing the set operation, the resistance (R) of the protective resistance layer 34 is in a high state.

Accordingly, the voltage drop of the set voltage (ΔV) is made large. During the time C, a voltage lower than the set voltage (ΔV) is applied to the memory layer 31. Thus, in the nonvolatile memory device 1, the memory layer 31 is less likely to be subjected to electrical stress than in the nonvolatile memory device 100, 101. Here, also in the transition from the set state (low resistance state) to the reset state (high resistance state), similarly, the memory layer 31 is less likely to be subjected to electrical stress. That is, in the nonvolatile memory device 1, information can be stably written to the memory layer 31.

Furthermore, at the time of reading information (Read), in the nonvolatile memory device 1, the resistance of the protective resistance layer 34 is low (FIG. 5A). Thus, the voltage drop of the voltage applied between the wiring 10 and the wiring 20 is made small. Hence, the voltage applied to the memory layer 31 is not made excessively lower than the read voltage applied between the wirings 10, 20. Accordingly, in the nonvolatile memory device 1, the written information can be stably read at the read voltage.

Figure 6A:
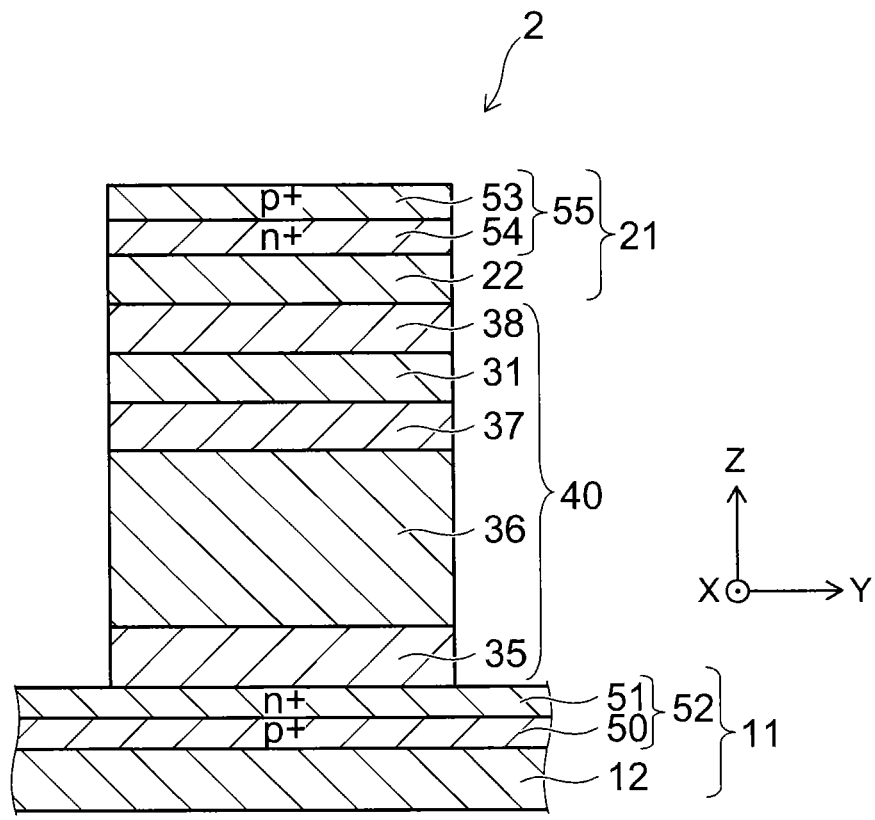
FIGS. 6A and 6B are schematic views of a nonvolatile memory device according to a second embodiment.
Figure 6B:
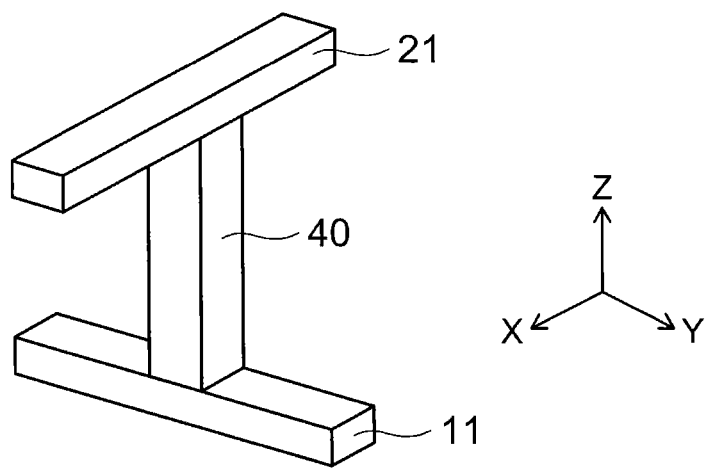

The voltage-current curve illustrated in FIG. 5A is one of examples. This curve can be appropriately adjusted by adjusting the composition of the protective resistance layer 34 (Si, SiGe), the concentration of the impurity element and the like Second Embodiment FIGS. 6A and 6B are schematic views of a nonvolatile memory device according to a second embodiment. FIG. 6A is a schematic sectional view, and FIG. 6B is a schematic perspective view.

The nonvolatile memory device 2 according to the second embodiment includes a wiring 11, a wiring 21, and a memory cell 40 sandwiched between the wiring 11 and the wiring 21. The wiring 11 extends in the Y direction in the figure. The wiring 21 extends in the X direction. A memory layer 31 is located between the wiring 11 and the wiring 21 crossing each other. The memory cell 40 includes a memory layer 31.

At least one of the wiring 11 and the wiring 21 includes a metal layer and a protective resistance layer. For instance, the nonvolatile memory device 2 includes three structures:

(1) A structure in which the wiring 11 includes a metal layer 12 and a protective resistance layer 52, and the wiring 21 includes a metal layer 22 and a protective resistance layer 55;

(2) A structure in which only the wiring 11 includes a metal layer 12 and a protective resistance layer 52; and (3) A structure in which only the wiring 21 includes a metal layer 22 and a protective resistance layer 55.

In FIG. 6A, the above structure (1) is illustrated as an example. The protective resistance layer 52 includes a $p^+$-type semiconductor layer 50 and an $n^+$-type semiconductor layer 51. The semiconductor layer 50 is in contact with the semiconductor layer 51. The protective resistance layer 55 includes a $p^+$-type semiconductor layer 53 and an $n^+$-type semiconductor layer 54. The semiconductor layer 53 is in contact with the semiconductor layer 54.

The material of the semiconductor layers 50, 53 is the same as the material of the semiconductor layer 32. The material of the semiconductor layers 51, 54 is the same as the material of the semiconductor layer 33. The material of the metal layer 12 is the same as the material of the wiring 10. The material of the metal layer 22 is the same as the material of the wiring 20.

More specifically, the protective resistance layer 52, 55 includes an Esaki diode in which a $p^+$-type semiconductor layer and an $n^+$-type semiconductor layer are in contact with each other. In the state shown in FIG. 6A, the stacking direction of the $p^+$-type semiconductor layer 50 and the $n^+$-type semiconductor layer 51 is opposite to the stacking direction of the $p^+$-type semiconductor layer 53 and the $n^+$-type semiconductor layer 54. The reason for this will be described later.

In the memory cell 40, from the wiring 11 side to the wiring 21 side, the metal film 35, the rectifying element layer 36, the metal film 37, the memory layer 31, and the metal film 38 are stacked. In the memory cell 40, the rectifying element layer 36 and the memory layer 31 are connected in series. Thus, a current flows in one direction of the memory cell 40.

The concentration of the impurity element contained in the semiconductor layer 50 does not need to be constant in the stacking direction (Z direction) of the memory cell 40. For instance, in order to join the semiconductor layer 50 and the metal layer 12 by ohmic contact, the concentration of the impurity element contained in the semiconductor layer 50 is made higher toward the metal layer 12.

Similarly, the concentration of the impurity element contained in the semiconductor layer 51 does not need to be constant in the stacking direction (Z direction) of the memory cell 40, either. For instance, in order to join the semiconductor layer 51 and the metal film 35 by ohmic contact, the concentration of the impurity element contained in the semiconductor layer 51 is made higher toward the metal film 35. Also in each of the semiconductor layers 53, 54, similarly, it does not need to be constant in the stacking direction (Z direction) of the memory cell 40, either.

In FIGS. 6A and 6B, the wiring 11, the wiring 21, and the memory cell 40 are illustrated one for each. However, the number of them is not limited to one (described later).

Thus, in the nonvolatile memory device 2, the protective resistance layer is provided outside the memory cell 40. That is, the protective resistance layer is incorporated into at least one of the word line and the bit line.

The operation of the nonvolatile memory device 2 is now described.

Figure 7A:
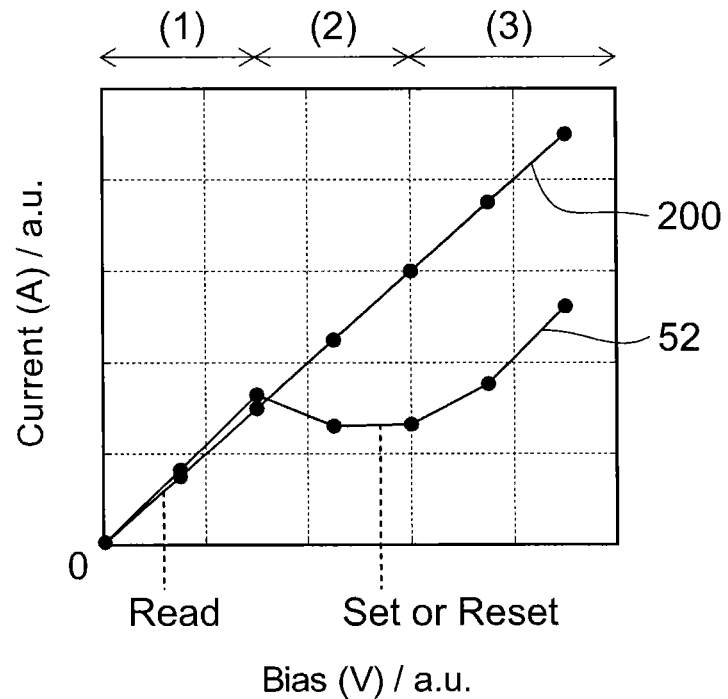
FIG. 7A shows a voltage-current curve of the protective resistance layer according to the second embodiment and FIG. 7B is a schematic sectional view describing the set operation of the nonvolatile memory device according to the second embodiment.
Figure 7B:
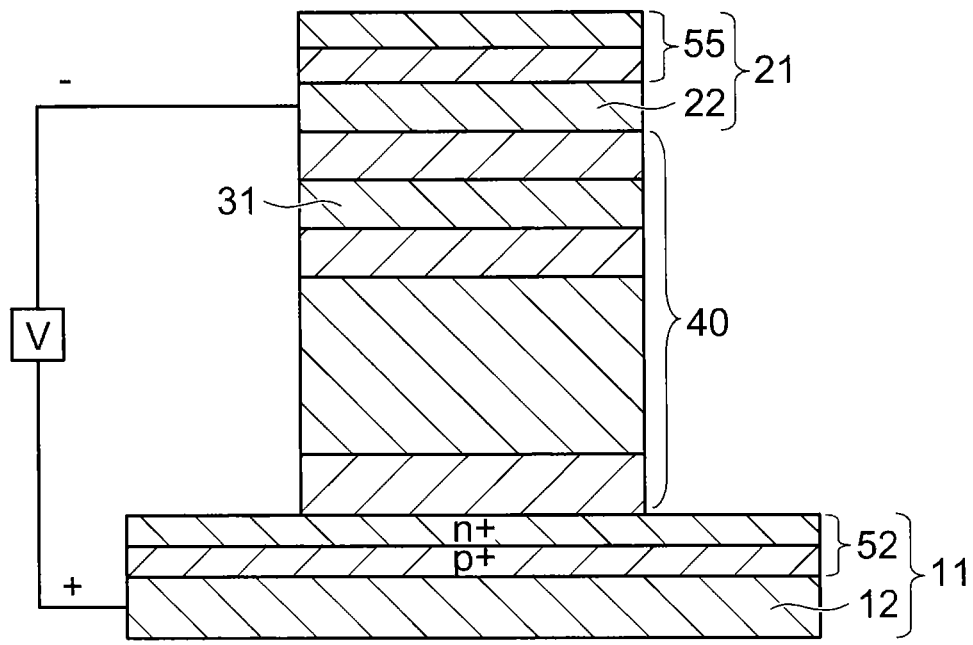

FIG. 7A shows a voltage-current curve of the protective resistance layer according to the second embodiment. FIG. 7B is a schematic sectional view describing the set operation of the nonvolatile memory device according to the second embodiment.

The horizontal axis and vertical axis of FIG. 7A are represented in a.u. (arbitrary units). Besides illustrating the voltage-current curve of the protective resistance layer 52 of the nonvolatile memory device 2, FIG. 7A illustrates a voltage-current curve of the protective resistance layer 200 according to the reference example. In the set operation shown in FIG. 7B, as an example, a positive potential is applied to the metal layer 12, and a negative potential is applied to the metal layer 22.

The voltage in the region (1) can be used as a read voltage, and the voltage in the region (2) can be used as a set voltage. Then, the protective resistance layer 52 functions as a layer having a sufficiently low resistance at the time of reading and having a sufficiently high resistance at the time of the set operation.

The set operation is performed on the nonvolatile memory device 2 including such a protective resistance layer 52. As described above, after starting the set operation and before completing the set operation, the memory layer 31 may transition from the reset state to the set state (FIG. 4B). That is, the time B is made shorter than the time A. Thus, even after the memory layer 31 transitions from the reset state to the set state, the voltage ΔV is applied between the wiring 11 and the wiring 21.

However, the protective resistance layer 52 is a layer having a sufficiently low resistance at the time of reading and having a sufficiently high resistance at the time of the set operation (FIG. 7A). Thus, during the time (time C) after the memory layer 31 transitions to the set state until completing the set operation, the resistance (R) of the protective resistance layer 52 is in a high state.

Accordingly, the voltage drop of the set voltage (ΔV) is made large. During the time C, a voltage lower than the set voltage (ΔV) is applied to the memory layer 31. Thus, also in the nonvolatile memory device 2, the memory layer 31 is less likely to be subjected to electrical stress. Here, also in the transition from the set state (low resistance state) to the reset state (high resistance state), similarly, the memory layer 31 is less likely to be subjected to electrical stress. That is, in the nonvolatile memory device 2, information can be stably written to the memory layer 31.

Furthermore, at the time of reading information (Read), in the nonvolatile memory device 2, the resistance of the protective resistance layer 52 is low (FIG. 7A). Thus, the voltage drop of the voltage applied between the wiring 11 and the wiring 21 is made small. Hence, the voltage applied to the memory layer 31 is not made excessively lower than the read voltage. Accordingly, in the nonvolatile memory device 2, the written information can be stably read at the read voltage applied between the wirings 11, 21.

The voltage-current curve illustrated in FIG. 7A is one of examples. This curve can be appropriately adjusted by adjusting the composition of the protective resistance layer 52 (Si, SiGe), the concentration of the impurity element and the like.

In the first embodiment, the protective resistance layer 34 includes an Esaki diode. Thus, the resistance of the protective resistance layer 34 is inevitably higher than that of the monolayer protective resistance layer 200. Accordingly, the current flowing in the memory cell 30 may be made smaller than in the case based on the monolayer protective resistance layer 200.

In contrast, the protective resistance layer 52, 55 according to the second embodiment is part of the word line or the bit line. Thus, the volume of the protective resistance layer 52, 55 according to the second embodiment is larger than the volume of the protective resistance layer 34 according to the first embodiment. Hence, the resistance of the protective resistance layer 52, 55 is lower than that of the protective resistance layer 34. Thus, the value of current flowing in the memory cell 40 is larger than the value of current flowing in the memory cell 30. Accordingly, in the second embodiment, the sensitivity of reading and the accuracy of writing are further improved.

Third Embodiment

Figure 8A:
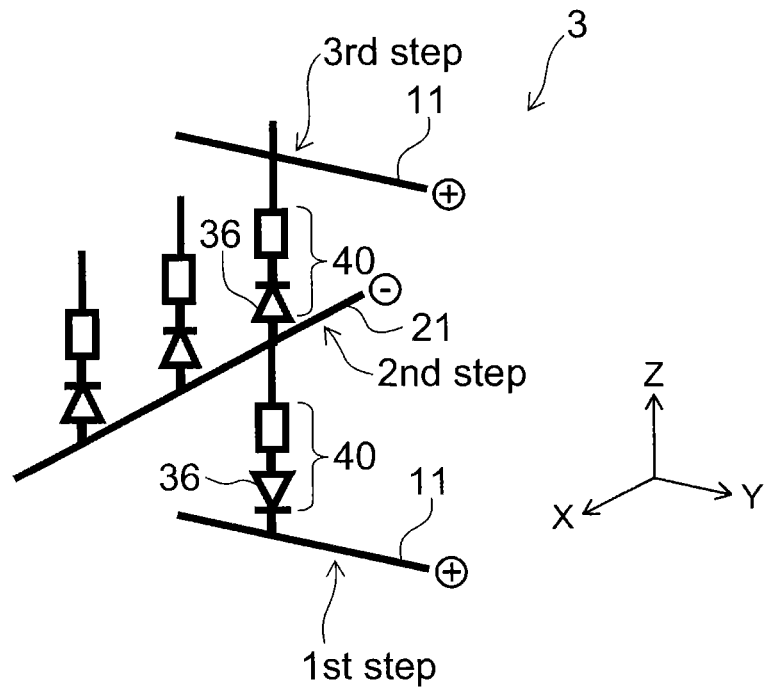
FIG. 8A is a schematic view of a memory cell array section of a nonvolatile memory device according to a third embodiment and FIG. 8B is a schematic sectional view of wirings of the nonvolatile memory device according to the third embodiment.
Figure 8B:
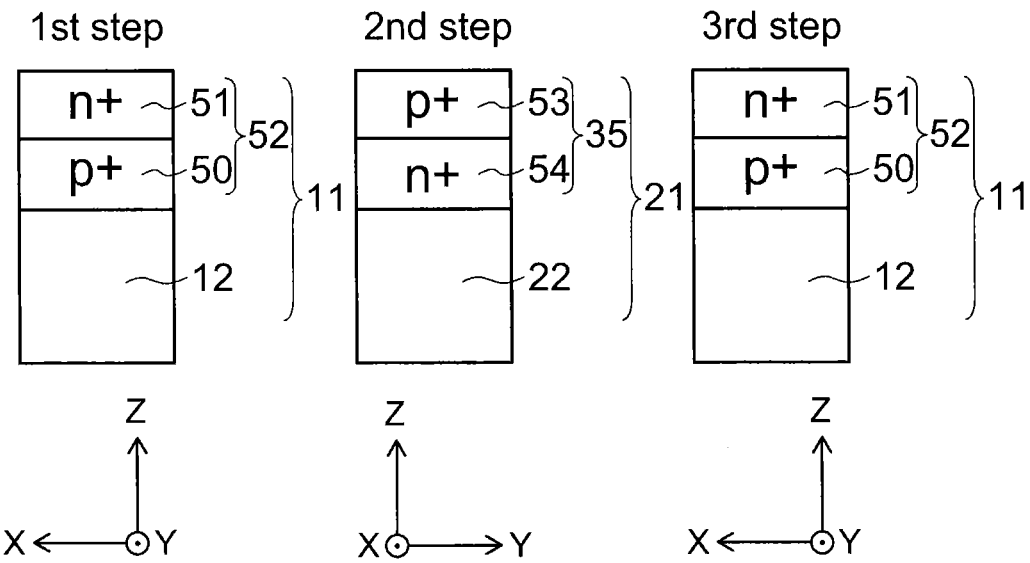

FIG. 8A is a schematic view of a memory cell array section of a nonvolatile memory device according to a third embodiment. FIG. 8B is a schematic sectional view of wirings of the nonvolatile memory device according to the third embodiment.

FIG. 8B shows a cross section of the first-stage wiring 11, a cross section of the second-stage wiring 21, and a cross section of the third-stage wiring 11 of FIG. 8A.

The nonvolatile memory device 3 according to the third embodiment includes a wiring 11, a wiring 21 provided on an upper side of the wiring 11, and a wiring 11 provided on an upper side of the wiring 21. Furthermore, the nonvolatile memory device 3 includes a memory cell 40 sandwiched between the first-stage wiring 11 and the second-stage wiring 21, and a memory cell 40 sandwiched between the second-stage wiring 21 and the third-stage wiring 11.

FIG. 8A illustrates structures in which each of the first-stage wiring 11, the second-stage wiring 21, and the third-stage wiring 11 include a metal layer, a p$^+$-type semiconductor layer, and an n$^+$-type semiconductor layer. The third embodiment also includes a structure in which at least one of the first-stage wiring 11, the second-stage wiring 21, and the third-stage wiring 11 includes a metal layer, a p$^+$-type semiconductor layer, and an n$^+$-type semiconductor layer. The rectifying element layer 36 illustrated in FIG. 8A is a diode which, besides exhibiting rectification characteristics, allows flow of a prescribed current even under application of reverse bias.

In the nonvolatile memory device 3, the p$^+$-type semiconductor layer 50 included in the first-stage wiring 11 is placed on a lower side of the n$^+$-type semiconductor layer 51. The p$^+$-type semiconductor layer 53 included in the second-stage wiring 21 is placed on an upper side of the n$^+$-type semiconductor layer 54. The p$^+$-type semiconductor layer 50 included in the third-stage wiring 11 is placed on a lower side of the n$^+$-type semiconductor layer 51.

In the nonvolatile memory device 3, at the time of the set operation, a potential of a first polarity (e.g., positive potential) can be applied to the first-stage wiring 11 and the third-stage wiring 11. A potential of a second polarity (e.g., negative potential) different from the potential of the first polarity can be applied to the second-stage wiring 21. That is, a potential of the same polarity is applied to the wirings of the odd-numbered stages. A potential different in polarity from that applied to the wirings of the odd-numbered stages is applied to the wirings of the even-numbered stages. The bias direction is different from the odd-numbered stages to the even-numbered stages.

At the time of the set operation, a current flows from the first-stage wiring 11 through the memory cell 40 to the metal layer 22 of the second-stage wiring 21. At this time, the semiconductor layers 50, 51 in the first-stage wiring 11 function as a protective resistance layer. Furthermore, at the time of the set operation, a current flows from the metal layer 12 in the third-stage wiring 11 through the memory cell 40 to the second-stage wiring 21. At this time, the semiconductor layers 53, 54 in the second-stage wiring 21 function as a protective resistance layer. Such a flow of current is enabled because the stacking order of the p$^+$-type semiconductor layer and the n$^+$-type semiconductor layer in the protective resistance layer of the odd-numbered stage is made opposite to the stacking order of the p$^+$-type semiconductor layer and the n$^+$-type semiconductor layer in the protective resistance layer of the even-numbered stage.

In the nonvolatile memory device 3, the stacking order of each protective resistance layer may be interchanged. In this case, the p$^+$-type semiconductor layer 50 included in the first-stage wiring 11 is placed on an upper side of the n$^+$-type semiconductor layer 51. The p$^+$-type semiconductor layer 53 included in the second-stage wiring 21 is placed on a lower side of the n$^+$-type semiconductor layer 54. Furthermore, the p+-type semiconductor layer 50 included in the third-stage wiring 11 is placed on an upper side of the n+-type semiconductor layer 51.

In this case, at the time of the set operation, a negative potential is applied to the first-stage wiring 11 and the third-stage wiring 11, and a positive potential is applied to the second-stage wiring 21. Also in this case, a potential of the same polarity is applied to the wirings of the odd-numbered stages. A potential different in polarity from that applied to the wirings of the odd-numbered stages is applied to the wirings of the even-numbered stages.

The description is given above of the embodiments with reference to the specific examples. However, the embodiments are not limited to these specific examples. In other words, configurations to which those skilled in the art appropriately apply design changes to these specific examples are included in the scope of the embodiments, as long as they are provided with the features of the embodiments. The arrangement, the material, the condition, the shape, the size and the like of each of the elements provided in each of the specific examples are not limited to the exemplified ones, but can be appropriately changed.

Further, each of the elements which are provided in each of the embodiments mentioned above can be combined as long as it can be technically achieved, and the combination is included in the scope of the embodiments as long as it includes the feature of the embodiments. In addition, in the category of the ideas of the embodiments, those skilled in the art can derive various variations and modifications, and it is understood that the variations and the modifications belong to the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device comprising: a first wiring; a second wiring; and a memory cell provided between the first wiring and the second wiring, the memory cell including:
a memory layer;
a rectifying element layer including a first diode; and
a protective resistance layer including a second diode with a first semiconductor layer of a first conductivity type and a second semiconductor layer of a second conductivity type being in contact with the first semiconductor layer stacked.

2. The device according to claim 1, wherein
material of the first semiconductor layer and material of the second semiconductor layer include polysilicon (poly-Si), and
concentration of an impurity element contained in the polysilicon is $1\times10^{19}$ atoms/cm$^3$ or more.

3. The device according to claim 1, wherein material of the first semiconductor layer and material of the second semiconductor layer include a mixed crystal of silicon (Si) and germanium (Ge).

4. The device according to claim 2, wherein the polysilicon included in the first semiconductor layer is doped with boron (B).

5. The device according to claim 2, wherein the polysilicon included in the second semiconductor layer is doped with phosphorus (P) or arsenic (As).

6. The device according to claim 2, wherein
the memory cell includes a stacked body with the memory layer, the first semiconductor layer, and the second semiconductor layer stacked, and
the concentration of the impurity element of the polysilicon included in the first semiconductor layer is not constant in stacking direction of the stacked body.

7. The device according to claim 2, wherein
the memory cell includes a stacked body with the memory layer, the first semiconductor layer, and the second semiconductor layer stacked, and
the concentration of the impurity element of the polysilicon included in the second semiconductor layer is not constant in stacking direction of the stacked body.

8. The device according to claim 2, wherein the second diode is an Esaki diode.

9. A nonvolatile memory device comprising:
a first wiring;
a second wiring; and
a memory cell provided between the first wiring and the second wiring and including a memory layer,
one of the first wiring and the second wiring being a bit line,
other one of the first wiring and the second wiring being a word line, and
at least one of the first wiring and the second wiring including:
a metal layer; and
a protective resistance layer including a diode with a first semiconductor layer of a first conductivity type and a second semiconductor layer of a second conductivity type being in contact with the first semiconductor layer stacked.

10. The device according to claim 9, further comprising:
a metal film containing at least one of titanium (Ti) and titanium nitride (TIN) between the metal layer and the protective resistance layer.

11. The device according to claim 9, wherein
the first wiring and the second wiring include the first semiconductor layer and the second semiconductor layer, and
stacking direction of the first semiconductor layer included in the first wiring and the second semiconductor layer included in the first wiring is opposite to stacking direction of the first semiconductor layer included in the second wiring and the second semiconductor layer included in the second wiring.

12. The device according to claim 9, wherein
material of the first semiconductor layer and material of the second semiconductor layer include polysilicon (poly-Si), and
concentration of an impurity element contained in the polysilicon is $1\times10^{19}$ atoms/cm$^3$ or more.

13. The device according to claim 11, wherein concentration of an impurity element of polysilicon included in the first semiconductor layer is not constant in the stacking direction.

14. The device according to claim 11, wherein concentration of an impurity element of polysilicon included in the second semiconductor layer is not constant in the stacking direction.

15. The device according to claim 12, wherein the diode is an Esaki diode.

16. A nonvolatile memory device comprising:
a first wiring;
a second wiring provided on an upper side of the first wiring;
a third wiring provided on an upper side of the second wiring;
a first memory cell provided between the first wiring and the second wiring and including a first memory layer; and
a second memory cell provided between the second wiring and the third wiring and including a second memory layer,
the first wiring, the second wiring, and the third wiring including:
a metal layer; and
a diode with a first semiconductor layer of a first conductivity type and a second semiconductor layer of a second conductivity type being in contact with the first semiconductor layer stacked,
wherein the first semiconductor layer included in the first wiring is placed on a lower side of the second semiconductor layer included in the first wiring,
the first semiconductor layer included in the second wiring is placed on an upper side of the second semiconductor layer included in the second wiring,
the first semiconductor layer included in the third wiring is placed on a lower side of the second semiconductor layer included in the third wiring, and
the diode included in the second wiring is placed between the metal layer included in the second wiring and the second memory cell and the metal layer included in the third wiring is placed between the diode included in the third wiring and the second memory cell when the diode included in the first wiring is placed between the metal layer included in the first wiring and the first memory cell.

17. The device according to claim 16, wherein a potential of a first polarity can be applied to the first wiring and the third wiring, and a potential of a second polarity different from the potential of the first polarity can be applied to the second wiring.

18. The device according to claim 16, further comprising: a metal film containing at least one of titanium (Ti) and titanium nitride (TIN) between a protective resistance layer and at least one of the first wiring and the second wiring, the protective resistance layer having the first semiconductor layer and the second semiconductor layer.

19. The device according to claim 16, wherein
material of the first semiconductor layer and material of the second semiconductor layer include polysilicon (poly-Si), and
concentration of an impurity element contained in the polysilicon is $1\times10^{19}$ atoms/cm$^3$ or more.

20. The device according to claim 19, wherein the diode is an Esaki diode.

* * * * *